US008415195B2

(12) United States Patent
Okumiya et al.

(10) Patent No.: US 8,415,195 B2
(45) Date of Patent: Apr. 9, 2013

(54) METHOD FOR MANUFACTURING SOLAR CELL MODULE

(75) Inventors: Hideaki Okumiya, Tochigi (JP); Satoshi Yamamoto, Tochigi (JP); Masao Saito, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 13/319,396

(22) PCT Filed: May 14, 2010

(86) PCT No.: PCT/JP2010/058177
§ 371 (c)(1),
(2), (4) Date: Nov. 8, 2011

(87) PCT Pub. No.: WO2010/140455
PCT Pub. Date: Dec. 9, 2010

(65) Prior Publication Data
US 2012/0058590 A1    Mar. 8, 2012

(30) Foreign Application Priority Data
Jun. 3, 2009   (JP) .................. 2009-134055

(51) Int. Cl.
  *H01L 21/00*   (2006.01)
  *H01L 29/80*   (2006.01)
(52) U.S. Cl.
  USPC ............................................. 438/78; 257/257
(58) Field of Classification Search .................. 257/184,
  257/229, 257; 438/57, 78
See application file for complete search history.

(56) References Cited

U.S. PATENT DOCUMENTS

| 8,070,902 | B2 * | 12/2011 | Ryu | .............................. 156/228 |
| 2007/0011863 | A1 * | 1/2007 | Yoshikawa | .................... 29/592.1 |
| 2008/0121265 | A1 | 5/2008 | Hishida et al. | |
| 2008/0149161 | A1 | 6/2008 | Nishida et al. | |

FOREIGN PATENT DOCUMENTS

| JP | A-2000-340811 | 12/2000 |
| JP | A-2002-319691 | 10/2002 |
| JP | 2004179261 | * 6/2004 |
| JP | A-2004-179261 | 6/2004 |

(Continued)

OTHER PUBLICATIONS

International Search Report in International Application No. PCT/JP2010/058177; dated Sep. 14, 2010 (with English-language translation).

(Continued)

*Primary Examiner* — Calvin Lee
(74) *Attorney, Agent, or Firm* — Oliff & Berridge, PLC

(57) ABSTRACT

In manufacturing of a solar cell module in which a solar cell having a surface electrode to which a tab lead is connected is sealed with a resin, the step of connecting the tab lead and the step of sealing the solar cell with the resin are performed simultaneously at a relatively low temperature that is used for the resin sealing step. To perform these steps simultaneously, the solar cell having the surface electrode to which the tab lead is connected with an adhesive is resin-sealed using a vacuum laminator to manufacture the solar cell module. The vacuum laminator used includes a first chamber and a second chamber partitioned by a flexible sheet. The internal pressures of these chambers can be controlled independently, and a heating stage for heating is provided in the second chamber.

20 Claims, 12 Drawing Sheets

FOREIGN PATENT DOCUMENTS

| | | |
|---|---|---|
| JP | A-2004-356349 | 12/2004 |
| JP | A-2008-135652 | 6/2008 |
| JP | A-2008-147567 | 6/2008 |
| JP | A-2008-159895 | 7/2008 |
| JP | A-2008-205045 | 9/2008 |
| JP | A-2008-300403 | 12/2008 |
| JP | A-2009-088152 | 4/2009 |
| JP | A-2009-88152 | 4/2009 |

OTHER PUBLICATIONS

Dec. 5, 2012 Japanese Office Action issued in Japanese Patent Application No. 2009-134055 (with translation).

* cited by examiner

METHOD FOR MANUFACTURING SOLAR CELL MODULE

TECHNICAL FIELD

The present invention relates to a method for manufacturing a solar cell module in which a solar cell having a surface electrode to which a tab lead is connected is sealed with a resin.

BACKGROUND ART

Conventionally, to manufacture a solar cell module, the front surface of one of adjacent solar cells and the rear surface of the other solar cell are first connected by solder-coated copper foil ribbons used as tab leads. This procedure is repeated for a plurality of solar cells to produce a solar cell unit. Next, transparent ethylene-vinyl acetate copolymer (EVA) sheets used as a sealing resin are disposed on both sides of the solar cell unit. If necessary, a transparent protection plate such as a transparent glass plate is disposed on the front side, and a light-resistant resin sheet is disposed on the rear side. The entire stacked product obtained is subjected to thermo-compression bonding to produce the solar cell module (paragraphs 0003 to 0010 in Patent Literature 1). It has also been proposed to use a vacuum laminator including a pressure-reducing unit and a heating plate when thermo-compression bonding is performed (Patent Literature 2). Patent Literature 2 states that the use of the vacuum laminator can prevent the occurrence of voids in the thereto-compression bonded areas.

CITATION LIST

Patent Literature

Patent Literature 1: Japanese Patent Application Laid-Open No. 2002-319691
Patent Literature 2: Japanese Patent Application Laid-Open No. 2004-356349

SUMMARY OF INVENTION

Problems to be Solved by the Invention

However, the temperature when the solder-coated tab leads are connected to the solar cells (a tab lead connecting step) is relatively high, i.e., 240° C. or higher, and the temperature during resin-sealing with the EVA sheets (a resin sealing step) is relatively low, i.e., about 150° C. The temperatures in these steps are different as described above. Therefore, these steps must be performed separately in time. This causes an increase in manufacturing tact time and an increase in frequency of handling, resulting in a problem that the manufacturing cost increases. In addition, since the high temperature during the tab lead connecting step causes accumulation of internal stress in the solar cells, failure such as cracks may occur in the solar cells during the resin sealing step.

To perform the tab lead connecting step and the resin sealing step simultaneously at a relatively low temperature, i.e., the temperature used in the resin sealing step, for example, conductive adhesive films that can establish connection at the temperature used during resin-sealing with an EVA sheet are used on solar cells. Then tab leads are placed on the conductive adhesive films, and the EVA sheet is placed thereon. If necessary, a transparent protection plate such as a transparent glass plate is placed on the front side, and a light-resistant resin sheet is placed on the rear side. Then the entire stacked product obtained is resin-sealed by thermo-compression bonding.

In FIG. 9, an adhesive 93 such as a conductive adhesive paste (AP), a conductive adhesive film (AF), an anisotropic conductive paste (ACP), an anisotropic conductive adhesive film (ACF), a non-conductive adhesive paste (NCP), or a non-conductive adhesive film (NCF)), a tab lead 94, an EVA sheet 95, and an optional moisture-proof sheet 96 are stacked on a solar cell 92 provided with a surface electrode 91, and the stacked product is subjected to vacuum lamination processing. However, in this case, the side surfaces of the layer of the adhesive 93 are covered with the compressed EVA, and therefore the resin component in the adhesive 93 is not removed from the connection portion. This may cause a problem that reliable connection is not achieved. In particular, when the adhesive 93 is a conductive adhesive film, the conductive particles contained therein are not sufficiently crushed, so that reliable conductive connection may not be achieved. Therefore, even when a conductive adhesive film is used as the adhesive, the tab lead connecting step and the resin sealing step must still be performed separately in time.

The present invention solves the foregoing conventional problems. It is an object of the invention to allow, when a solar cell having a surface electrode to which a tab lead is connected is sealed with a resin to produce a solar cell module, a tab lead connecting step of connecting the tab lead to the surface electrode and a resin sealing step of sealing the solar cell with the sealing resin to be performed simultaneously at a relatively low temperature used in the resin sealing step.

Means for Solving the Problems

The present inventors have found that the following three means are effective to connect a tab lead to an electrode of a solar cell and seal the solar cell with a resin simultaneously at a relatively low temperature used for the resin-sealing of the solar cell. The first means is such that, in order to squeeze the adhesive out of the connection area when the tab lead is connected to the surface electrode of the solar cell with an adhesive (such as a CP, CF, ACP, ACF, NCP, or NCF), a pressurizing film is disposed between the tab lead and the sealing resin so that the pressing pressure of the sealing resin can be applied to a connection area while the connection area is separated from the sealing resin. The second means is such that, when the tab lead is connected to the surface electrode of the solar cell through a conductive adhesive film, conductive particles for conductive connection contained in the conductive adhesive film are caused to protrude from the base of the adhesive film so that the conductive particles can be crushed without the spread of the resin forming the adhesive film to the outside of a connection area. The third means is such that, when the tab lead itself is brought into direct contact with the solar cell having a surface electrode and is connected thereto with a thermosetting adhesive, the tab lead used includes a thermosetting adhesive layer formed on one side of a metal substrate, and convex portions of the metal substrate protrude from the thermosetting adhesive layer so that the tab lead can be directly connected to the surface electrode without the spread of the thermosetting adhesive to the outside of a connection area.

Accordingly, a first embodiment of the present invention provides a method for manufacturing a solar cell module in which a solar cell having a surface electrode to which a tab lead is connected with an adhesive is sealed with a resin using a vacuum laminator, the method comprising:

using as the vacuum laminator one including a first chamber and a second chamber partitioned by a flexible sheet, wherein the internal pressure of the first chamber and the internal pressure of the second chamber can be controlled independently and a heating stage for heating is provided in the second chamber;

sequentially stacking the solar cell having the surface electrode formed thereon on the heating stage in the second chamber of the vacuum laminator, the adhesive on the surface electrode, the tab lead on the adhesive, a pressurizing film on the tab lead, a sealing resin layer on the pressurizing film, and a moisture-proof back sheet or a glass plate on the sealing resin layer; and while the internal pressure of the first chamber of the vacuum laminator is increased relative to the internal pressure of the second chamber to press the flexible sheet against the moisture-proof back sheet or the glass plate, heating the solar cell by the heating stage to thereby connect the surface electrode of the solar cell to the tab lead and to resin-seal the solar cell with the sealing resin layer, whereby the solar cell module is obtained.

A second embodiment of the present invention provides a method for manufacturing a solar cell module in which a solar cell having a surface electrode to which a tab lead is connected through a conductive adhesive film is sealed with a resin using a vacuum laminator, the method comprising:

using as the conductive adhesive film one including a thermosetting resin film base and conductive particles that have a diameter larger than the thickness of the thermosetting resin film base and are held therein, the conductive particles protruding from at least one side of the thermosetting resin film base;

using as the vacuum laminator one including a first chamber and a second chamber partitioned by a flexible sheet, wherein the internal pressure of the first chamber and the internal pressure of the second chamber can be controlled independently and a heating stage for heating is provided in the second chamber;

sequentially stacking the solar cell having the surface electrode formed thereon on the heating stage in the second chamber of the vacuum laminator, the conductive adhesive film on the surface electrode, the tab lead on the conductive adhesive film, a sealing resin layer on the tab lead, and a moisture-proof back sheet or a glass plate on the sealing resin layer, provided that the conductive adhesive film is stacked on the surface electrode such that the surface of the conductive adhesive film from which the conductive particles protrude faces the tab lead or the surface electrode; and while the internal pressure of the first chamber of the vacuum laminator is increased relative to the internal pressure of the second chamber to press the flexible sheet against the moisture-proof back sheet or the glass plate, heating the solar cell by the heating stage to thereby conductively connect the surface electrode of the solar cell to the tab lead and to resin-seal the solar cell with the sealing resin layer, whereby the solar cell module is obtained.

A third embodiment of the present invention provides a method for manufacturing a solar cell module in which a solar cell having a surface electrode to which a tab lead is connected is sealed with a resin using a vacuum laminator, the method comprising:

using as the tab lead one including a metal substrate and a thermosetting adhesive layer formed on one side of the metal substrate, the metal substrate having a convex portion that protrudes from the thermosetting adhesive layer so as to be connectable to the surface electrode, or as the tab lead one including a metal substrate and a thermosetting adhesive layer formed on one side of the metal substrate, the surface electrode having a convex portion that is formed in a region to be connected to the tab lead;

using as the vacuum laminator one including a first chamber and a second chamber partitioned by a flexible sheet, wherein the internal pressure of the first chamber and the internal pressure of the second chamber can be controlled independently and a heating stage for heating is provided in the second chamber;

sequentially stacking the solar cell having the surface electrode formed thereon on the heating stage in the second chamber of the vacuum laminator, the tab lead on the surface electrode, a sealing resin layer on the tab lead, and a moisture-proof back sheet or a glass plate on the sealing resin layer, provided that the tab lead including the metal substrate having the convex portion protruding from the thermosetting adhesive layer is stacked on the surface electrode such that the surface of the tab lead from which the convex portion of the metal substrate protrudes faces the surface electrode; and while the internal pressure of the first chamber of the vacuum laminator is increased relative to the internal pressure of the second chamber to press the flexible sheet against the moisture-proof back sheet or the glass plate, heating the solar cell by the heating stage to thereby connect the surface electrode of the solar cell to the convex portion of the tab lead and to resin-seal the solar cell with the sealing resin layer, whereby the solar cell module is obtained.

Advantageous Effects of Invention

The first embodiment of the method for manufacturing a solar cell module of the present invention is configured such that, in order to squeeze the adhesive out of the connection area when the tab lead is connected to the surface electrode of the solar cell with an adhesive (such as a CP, CF, ACP, ACF, NCP, or NCF), a pressurizing film is disposed between the tab lead and the sealing resin so that the pressing pressure of the sealing resin can be applied to the connection area while the connection area is separated from the sealing resin.

The second embodiment is configured such that, when the tab lead is connected to the surface electrode of the solar cell through a conductive adhesive film, the conductive particles for conductive connection contained in the conductive adhesive film are caused to protrude from the base of the adhesive film so that the conductive particles can be crushed without the spread of the resin forming the adhesive film to the outside of a connection area.

The third embodiment is configured such that, when the tab lead itself is brought into direct contact with the solar cell having a surface electrode and is connected thereto with a thermosetting adhesive, the tab lead used includes a thermosetting adhesive layer formed on one side of a metal substrate, and convex portions of the metal substrate protrude from the thermosetting adhesive layer so that the tab lead can be directly connected to the surface electrode without the spread of the thermosetting adhesive to the outside of a connection area. Therefore, with any of the embodiments, the tab lead and the surface electrode of the solar cell can be thermo-compression bonded using a vacuum laminator with high connection reliability. Simultaneously, the solar cell can be sealed with a resin. When a convex portion is provided, instead of the convex portion formed on the tab lead, on the surface electrode, the same advantageous effects can be obtained.

DESCRIPTION OF EMBODIMENTS

A first embodiment of the present invention is a method for manufacturing a solar cell module in which a solar cell having a surface electrode to which a tab lead is connected with an adhesive is sealed with a resin using a vacuum laminator.

The vacuum laminator used in the present invention includes a first chamber and a second chamber partitioned by a flexible sheet. The inner pressures of these chambers can be controlled independently, and a heating stage for heating is provided in the second chamber. An example of such a vacuum laminator will be described in more detail with reference to FIG. 1.

Figure 1:
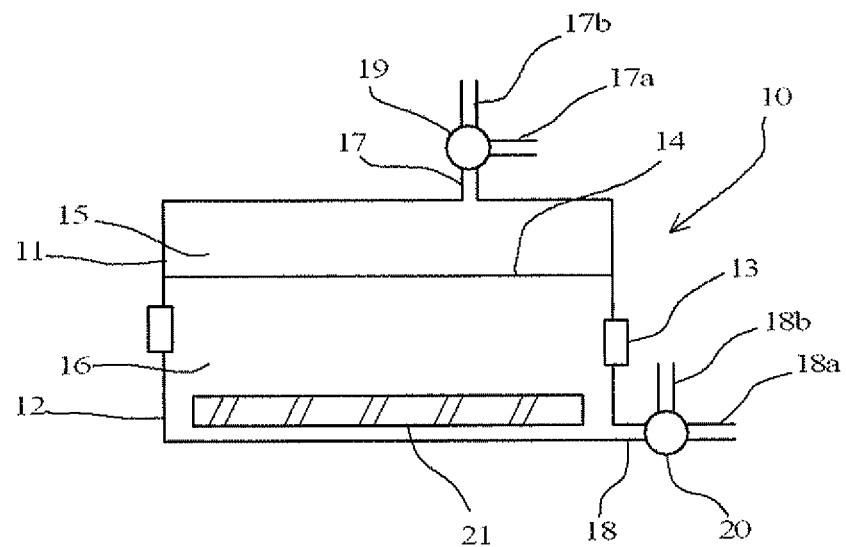
FIG. 1 is a schematic cross-sectional view of a vacuum laminator.

FIG. 1 shows the vacuum laminator 10 before use, and the vacuum laminator 10 includes an upper unit 11 and a lower unit 12. These units are separably integrated through a sealing member 13 such as an O-ring. A flexible sheet 14 of, for example, silicon rubber is provided in the upper unit 11, and the vacuum laminator 10 is partitioned into a first chamber 15 and a second chamber 16 by the flexible sheet 14. To prevent a molten sealing resin such as EVA from adhering to the surface of the flexible sheet 14 that faces the inside of the second chamber 16, a thin glass cloth-reinforced Teflon (registered trademark) sheet may be disposed on that surface.

Pipes 17 and 18 are provided for the upper unit 11 and the lower unit 12, respectively, so that the inner pressures of the respective chambers can be controlled independently, i.e., the pressures can be reduced and increased by vacuum pumps or compressors and the chambers can be open to the air. The pipe 17 is branched into two directions 17a and 17b through a switching valve 19, and the pipe 18 is branched into two directions 18a and 18b through a switching valve 20. A heating stage 21 is provided in the lower unit 12.

This vacuum laminator 10 is used as shown in, for example, FIGS. 2A to 2E.

Figure 2A:
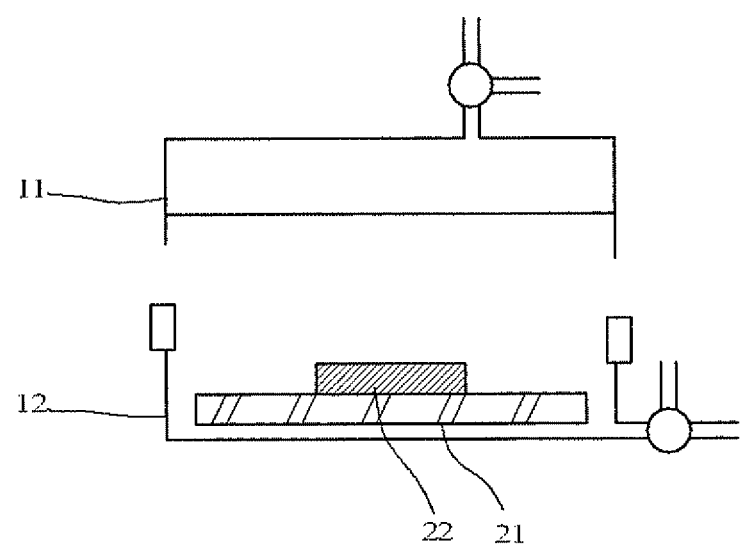
FIG. 2A is a diagram illustrating the use of the vacuum laminator.

First, as shown in FIG. 2A, the upper unit 11 and the lower unit 12 are separated from each other, and a stacked product 22 to be thereto-compression bonded is placed on the stage 21.

Figure 2B:
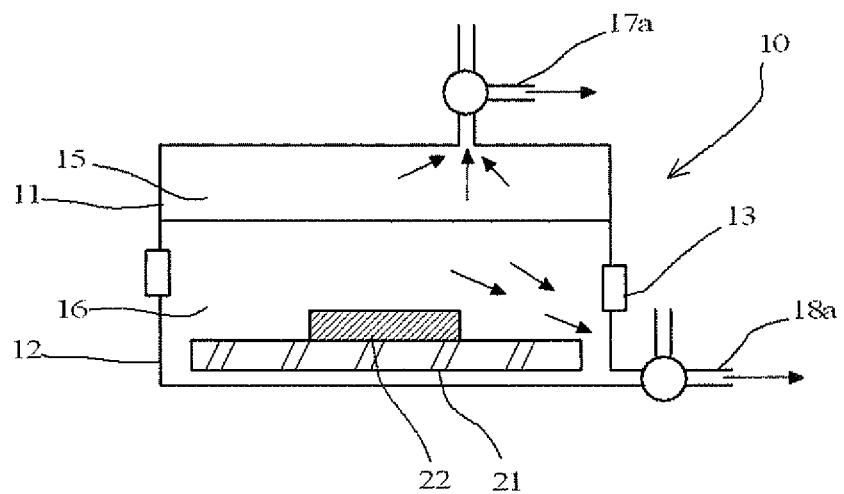
FIG. 2B is a diagram illustrating the use of the vacuum laminator.

Next, as shown in FIG. 2B, the upper unit 11 and the lower unit 12 are separably integrated through the sealing member 13. Then vacuum pumps (not shown) are connected to the pipes 17a and 18a to evacuate the first chamber 15 and the second chamber 16 to a high vacuum.

Figure 2C:
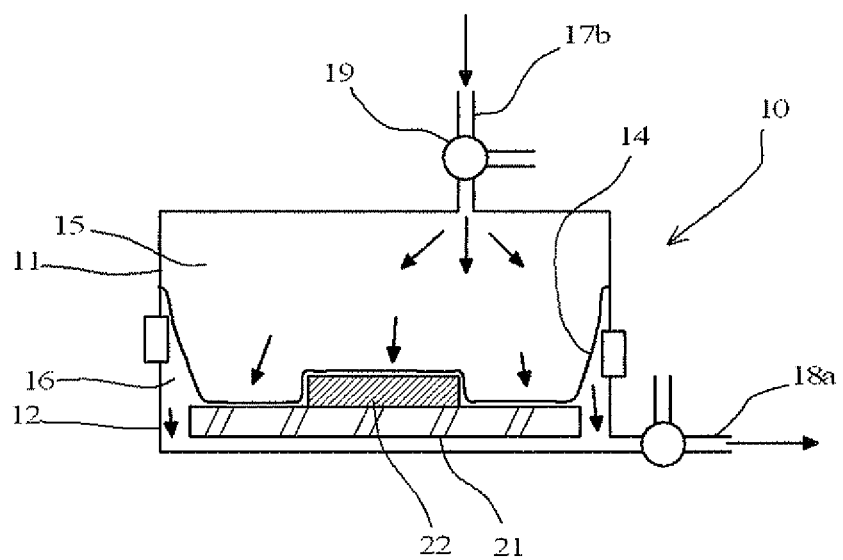
FIG. 2C is a diagram illustrating the use of the vacuum laminator.

While the second chamber 16 is maintained at a high vacuum, the switching valve 19 is switched to introduce air to the first chamber 15 through the pipe 17b, as shown in FIG. 2C. The flexible sheet 14 is thereby expanded toward the second chamber 16. Therefore, the stacked product 22 is pressed by the flexible sheet 14 while being heated by the stage 21.

Figure 2D:
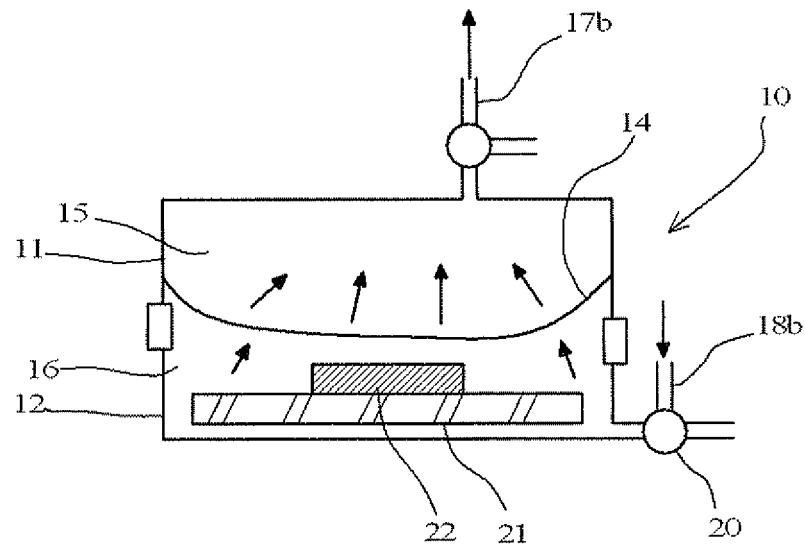
FIG. 2D is a diagram illustrating the use of the vacuum laminator.

Next, as shown in FIG. 2D, the switching valve 20 is switched to introduce air to the second chamber 16 through the pipe 18b. Then the flexible sheet 14 is pushed back toward the first chamber 15, and the internal pressures of the first chamber 15 and the second chamber 16 eventually become the same.

Figure 2E:
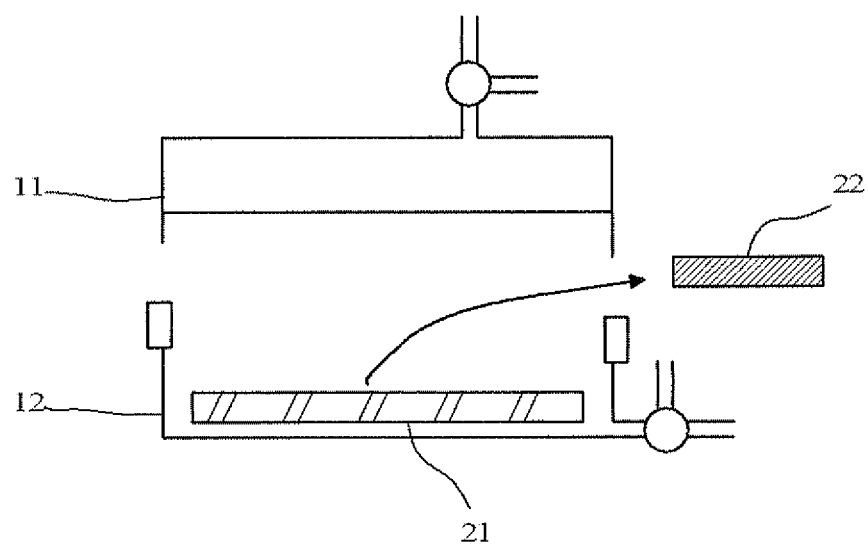
FIG. 2E is a diagram illustrating the use of the vacuum laminator.

Finally, as shown in FIG. 2E, the upper unit 11 and the lower unit 12 are separated from each other, and the thermo-compression bonded stacked product 22 is removed from the heating stage 21. The operation cycle of the vacuum laminator 10 is thereby completed, and the process returns to FIG. 2A.

When the stacked product 22 is a stack in which a conductive adhesive film is sandwiched between the surface electrode of a solar cell and a tab lead and a sealing resin layer is disposed over the entire surface of the solar cell, the operations shown in FIGS. 2A to 2D allow the conductive connection between the surface electrode and the tab lead and the resin-sealing of the conductive connection portion to be achieved simultaneously.

The vacuum laminator used in the present invention has been described above. However, the usable vacuum laminator is not limited to the vacuum laminator including the upper unit 11 and the lower unit 12 shown in FIG. 1. A vacuum laminator including one casing divided into two chambers and configured such that a stacked product is placed and removed through an open-close door may also be used. The first and second chambers may be designed such that compressed air is introduced to the first chamber to perform pressurization at a pressure equal to or higher than atmospheric pressure. In this case, the air inside the second chamber may be simply discharged without reducing the pressure inside the second chamber.

Figure 3A:
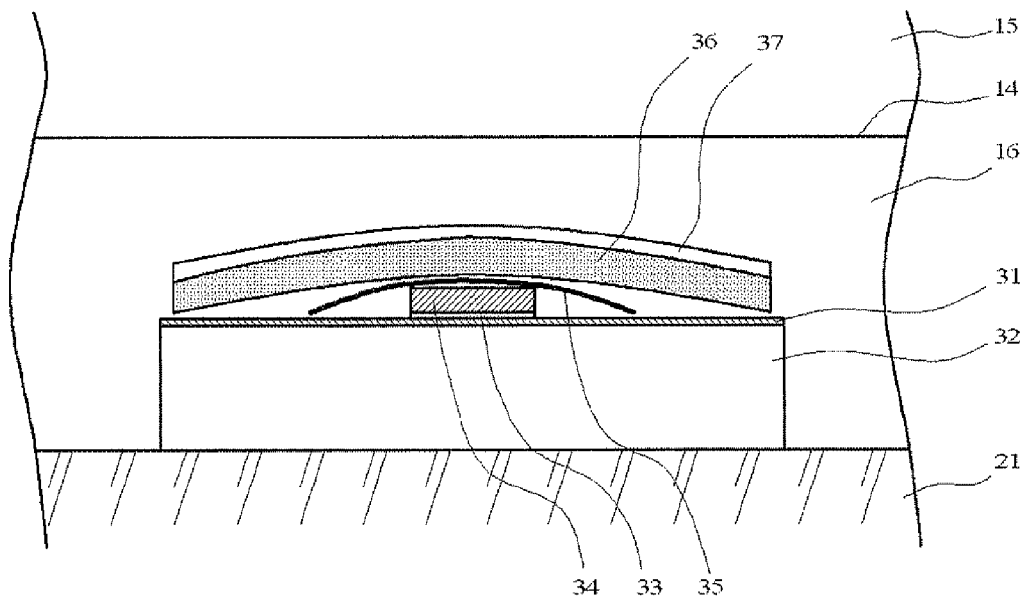
FIG. 3A is a diagram illustrating a step in a manufacturing method of a first embodiment of the present invention.

In the first embodiment of the present invention, as shown in FIG. 3A, a solar cell 32 having a surface electrode 31 formed thereon is stacked on the heating stage 21 in the second chamber 16 of the vacuum laminator partitioned from the first chamber 15 by the flexible sheet 14. Then, an adhesive 33 on the surface electrode 31, a tab lead 34 on the adhesive 33, a pressurizing film 35 on the tab lead 34, a sealing resin layer 36 on the pressurizing film 35, and a moisture-proof back sheet 37 or a glass plate (not shown) on the sealing resin layer 36 are sequentially stacked.

Figure 3B:
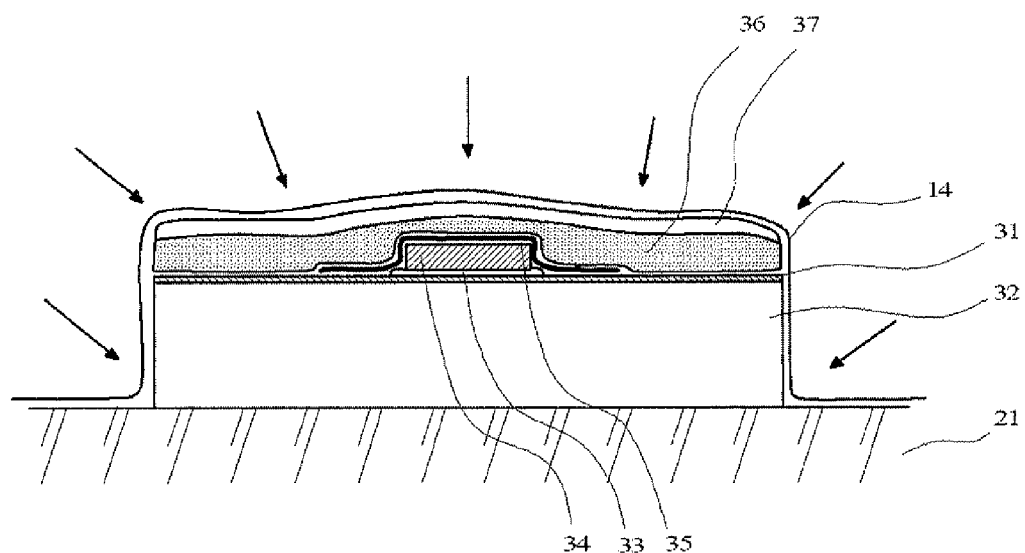
FIG. 3B is a diagram illustrating a step in the manufacturing method of the first embodiment of the present invention.
Figure 3C:
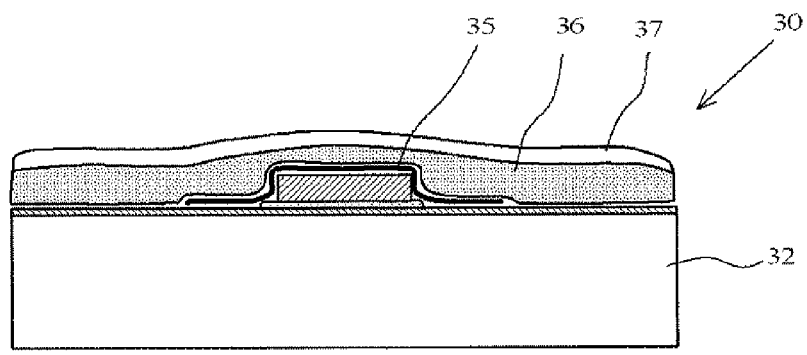
FIG. 3C is a schematic cross-sectional view of a solar cell module manufactured by the manufacturing method of the first embodiment of the present invention.

Next, as shown in FIG. 3B, the internal pressure of the first chamber of the vacuum laminator is increased relative to the internal pressure of the second chamber to press the flexible sheet 14 against the moisture-proof back sheet 37 or the glass plate, and simultaneously the solar cell 32 is heated by the heating stage 21. The surface electrode 31 of the solar cell 32 is thereby connected to the tab lead 34, and the solar cell 32 is resin-sealed with the sealing resin layer 36. A solar cell module 30 can be obtained in this manner (FIG. 3C).

Preferred examples of the operation for increasing the internal pressure of the first chamber 15 of the vacuum laminator relative to the internal pressure of the second chamber 16 include an operation including reducing the internal pressures of the first chamber 15 and the second chamber 16 and then opening the first chamber 15 to the air while the reduced pressure inside the second chamber 16 is maintained.

Any of the known adhesives, such as conductive adhesive pastes (CPs), conductive adhesive films (CFs), anisotropic conductive pastes (ACPs), anisotropic conductive adhesive films (ACFs), non-conductive adhesive pastes (NCPs), and non-conductive adhesive films (NCF's), used when electronic components are mounted on a solar cell can be used as the adhesive 33. A thermosetting adhesive is preferably used.

Any of resin films, synthetic paper sheets, non-woven fabrics, and the like that have thicknesses of 5 to 500 μm and exhibit dimensional stability even during heating and pressurization by the vacuum laminator can be used as the pressurizing film 35. Any of polyamide, polyimide, polyester, and the like can be used as the material that forms the pressurizing film 35. Preferably, the glass transition temperature of the pressurizing film 35 is higher than the laminating temperature of the sealing resin layer 36. Specifically, the glass transition temperature is at least 10° C. higher than the laminating temperature.

Preferably, the circumferential edges of the pressurizing film 35 are resin-sealed with the sealing resin layer 36. With this structure, a pressurizing film having no adhesive properties can be used as the pressurizing film 35.

A sealing resin layer formed of any of the known liquid- and paste-like sealing resin compositions can be used as the sealing resin layer 36, and a sealing resin sheet formed into a sheet shape is particularly preferably used. Specifically, a thermoplastic ethylene/vinyl acetate copolymer sheet having good sealing and adhesive properties can be preferably used. Generally, the sealing resin layer 36 flows when heated during resin-sealing and covers areas to be sealed. When the sealing resin layer 36 contains a curable component, good resin-sealing can be achieved by curing the sealing resin layer 36 after it flows.

The solar cell 32 having the surface electrode 31 is a solar cell required to be bonded to a tab lead and to be sealed with a resin. Examples of such a solar cell include crystalline solar cells using crystalline photoelectric conversion elements and thin-film solar cells using thin-film photoelectric conversion elements. A surface electrode may also be provided on the rear surface of the solar cell. In such a case, a solar cell unit composed of a plurality of solar cells can be formed (see FIG. 8 in Patent Literature 1 and FIG. 1 in Patent Literature 2). Any of the known materials can be used as the material of the photoelectric conversion element of the solar cell. Examples of such materials include single crystalline silicon, polycrystalline silicon, amorphous silicon, single crystalline compounds such as GaAs-based compounds, and polycrystalline compounds such as CdS and CdTe.

In a conventional solar cell module, the tab leads are used as inner leads for connecting the solar cells to each other or outer leads for outputting power. Solder-coated copper foil ribbons may be preferably used as the tab leads.

In the first embodiment of the present invention, the moisture-proof back sheet 37 or the glass plate is stacked on the sealing resin layer 36. The moisture-proof back sheet 37 or the glass plate used can be appropriately selected from those used in conventional solar cell modules.

A second embodiment of the present invention in which no pressurizing film is used will next be described.

The second embodiment of the present invention is a manufacturing method including sealing, with a resin using a vacuum laminator, a solar cell having a surface electrode to which a tab lead is connected through an isotropic or anisotropic conductive adhesive film (CF or ACF).

Figure 4A:
FIG. 4A is a cross-sectional view of a conductive adhesive film used in a second embodiment of the present invention.

In the second embodiment, a conductive adhesive film 41 used includes a thermosetting resin film base 42 and conductive particles 43 having a particle diameter larger than the thickness of the base and held therein, as shown in FIG. 4A. The conductive particles 43 protrude from at least one side of the thermosetting resin film base 42. Since the conductive particles 43 protrude from the thermosetting resin film base 42 as described above, the spaces between the conductive particles 43 accommodate the conductive particles 43 that have been crushed. Therefore, the conductive particles in the conductive adhesive film can be sufficiently crushed to establish conductive connection without using the pressurizing film used in the first embodiment. A thermosetting resin thin film (not shown) may be formed on the surface of each protruding conductive particle 43 within a range in which the effect of the present invention is not impaired.

In this second embodiment, no pressurizing film is used. Therefore, the second embodiment is advantageous in that, even when it is applied to the light-receiving side, a reduction in light-receiving efficiency due to the use of a pressurizing film is not required to be taken into consideration.

Figure 4B:
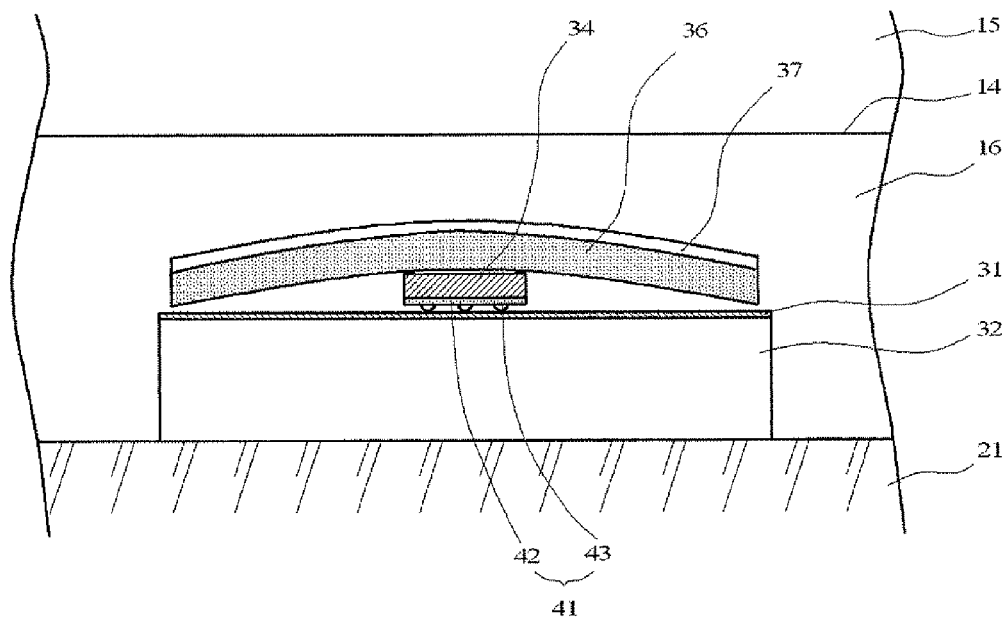
FIG. 4B is a diagram illustrating a step in a manufacturing method of the second embodiment of the present invention.

In the second embodiment, as shown in FIG. 4B, a solar cell 32 having a surface electrode 31 formed thereon is first stacked on the heating stage 21 in the second chamber 16 of the vacuum laminator partitioned from the first chamber 15 by the flexible sheet 14. Then a conductive adhesive film 41 on the surface electrode 31, a tab lead 34 on the conductive adhesive film 41, a sealing resin layer 36 on the tab lead 34, and a moisture-proof back sheet 37 or a glass plate (not shown) on the sealing resin layer 36 are sequentially stacked. Note that the conductive adhesive film 41 is stacked on the surface electrode 31 such that the surface of the conductive adhesive film 41 from which the conductive particles protrude faces the surface electrode 31.

Figure 4C:
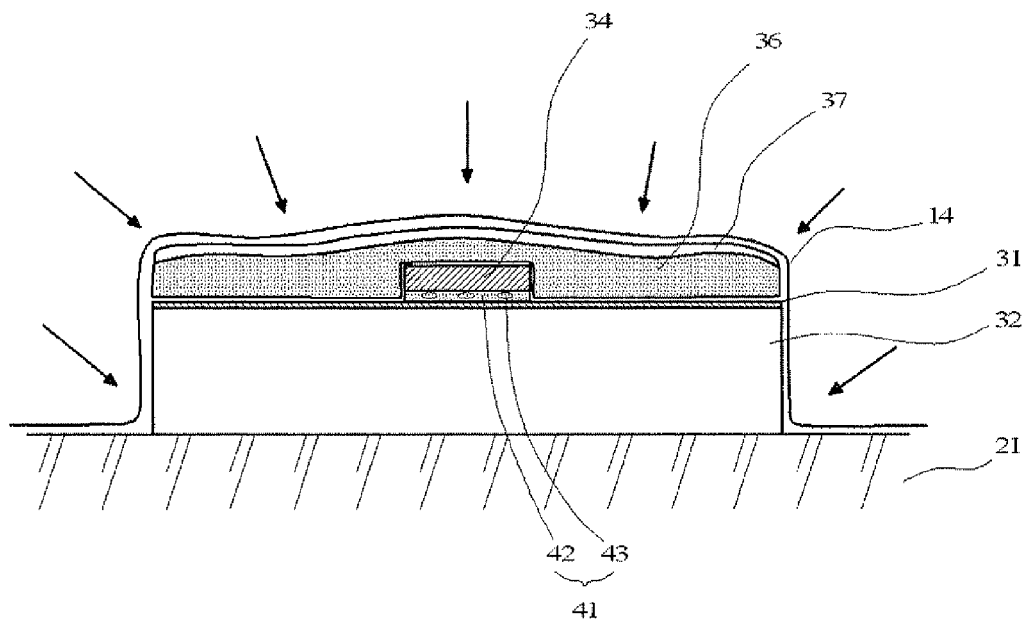
FIG. 4C is a diagram illustrating a step in the manufacturing method of the second embodiment of the present invention.
Figure 4D:
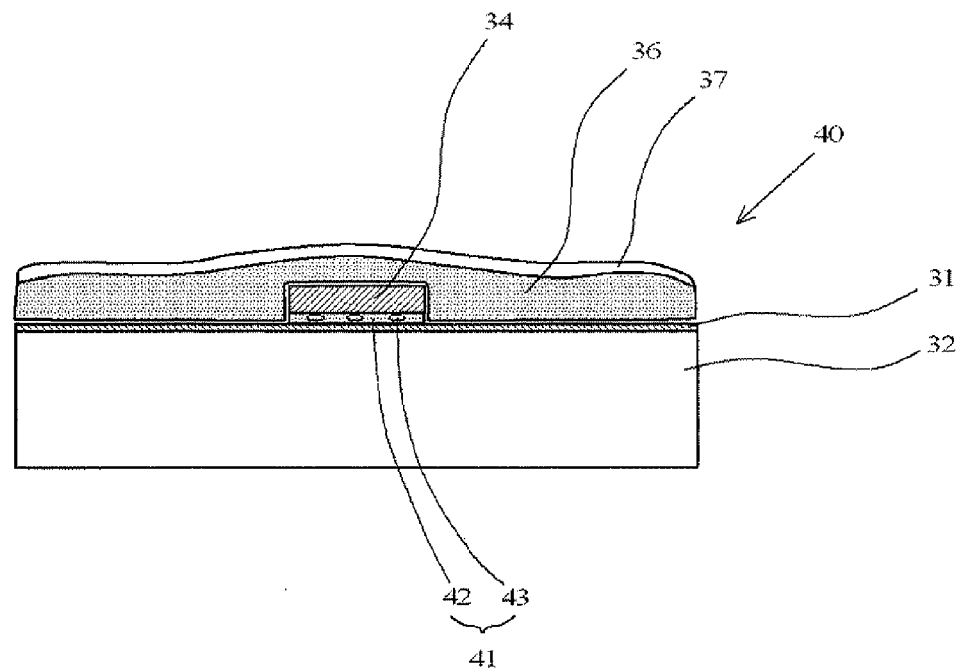
FIG. 4D is a schematic cross-sectional view of a solar cell module manufactured by the manufacturing method of the second embodiment of the present invention.

Next, as shown in FIG. 4C, the internal pressure of the first chamber of the vacuum laminator is increased relative to the internal pressure of the second chamber to press the flexible sheet 14 against the moisture-proof back sheet 37 or the glass plate, and simultaneously the solar cell 32 is heated by the heating stage 21. The surface electrode 31 of the solar cell 32 is thereby conductively connected to the tab lead 34, and the connection area of the solar cell 32 is resin-sealed with the sealing resin layer 36. A solar cell module 40 can be obtained in this manner (FIG. 4D).

"The operation for increasing the internal pressure of the first chamber of the vacuum laminator relative to the internal pressure of the second chamber," "the sealing resin sheet," "the solar cell having the surface electrode," "the moisture-proof back sheet," and "the glass plate" are as described in the first embodiment of the present invention.

A description will next be given of a third embodiment of the present invention that uses no pressurizing film, which is different from the second embodiment.

The third embodiment of the present invention is a method for manufacturing a solar cell module in which a solar cell having a surface electrode to which a tab lead is connected is sealed with a resin using a vacuum laminator. First, a description will be given of the case in which convex portions are formed on the tab lead.

Figure 5A:
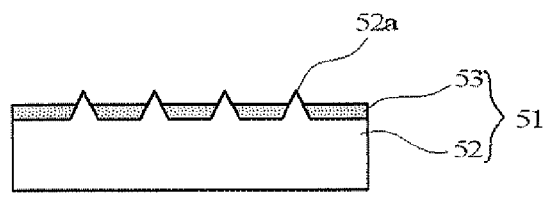
FIG. 5A is a cross-sectional view of a tab lead used in a third embodiment of the present invention.

In the third embodiment, as shown in FIG. 5A, the tab lead 51 used includes a metal substrate 52 and a thermosetting adhesive layer 53 formed on one side thereof, and convex portions 52a of the metal substrate 52 protrude from the thermosetting adhesive layer 53 so as to be connectable to the surface electrode. Since the convex portions 52a of the metal substrate 52 protrude from the thermosetting adhesive layer 53 as described above, the spaces between the convex portions 52a accommodate the convex portions 52a that have been crushed. Therefore, conductive connection can be established without using the pressurizing film used in the first embodiment. A thermosetting adhesive thin film (not shown) may be formed on the surface of each convex portion 52a within a range in which the effect of the present invention is not impaired.

Figure 5B:
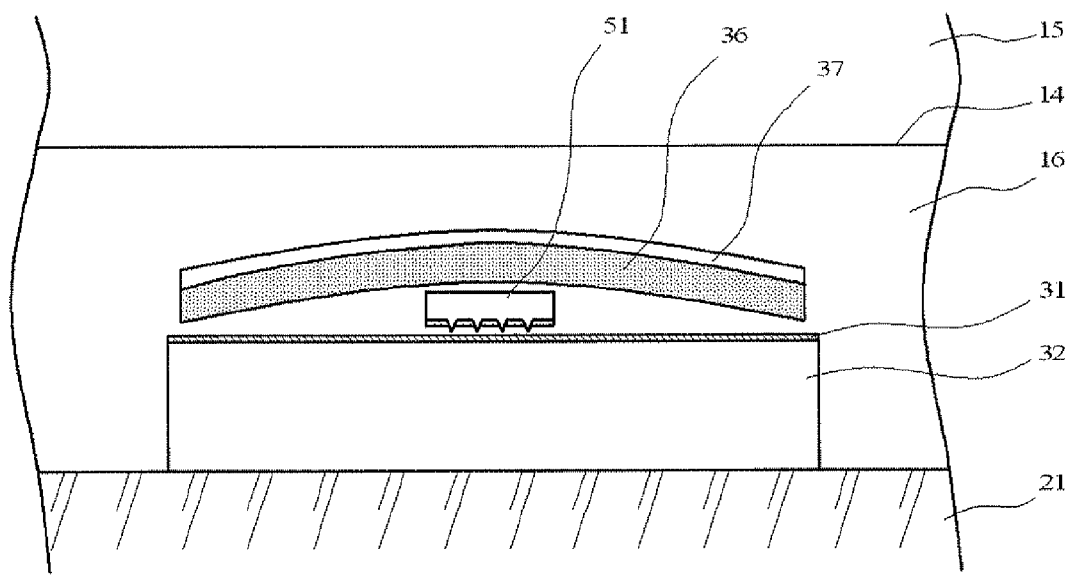
FIG. 5B is a diagram illustrating a step in a manufacturing method of the third embodiment of the present invention.

In the third embodiment, as shown in FIG. 5B, a solar cell 32 having a surface electrode 31 formed thereon is first stacked on the heating stage 21 in the second chamber 16 of the vacuum laminator partitioned from the first chamber 15 by the flexible sheet 14. Then the tab lead 51 on the surface electrode 31, a sealing resin layer 36 on the tab lead 51, a moisture-proof back sheet 37 or a glass plate (not shown) on the sealing resin layer 36 are sequentially stacked. Note that the tab lead 51 is stacked on the surface electrode 31 such that the surface of the tab lead 51 from which the convex portions 52a of the metal substrate 52 protrude faces the surface electrode 31.

Figure 5C:
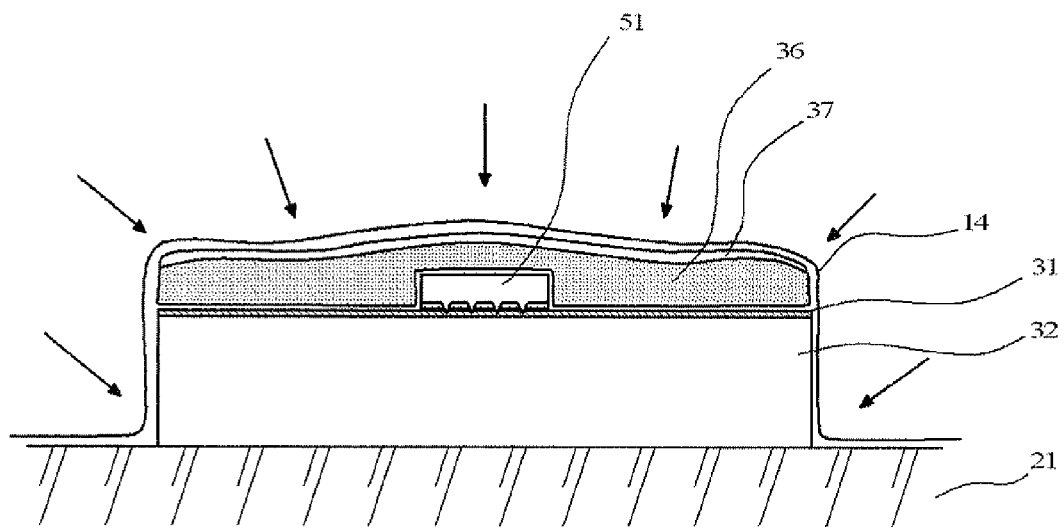
FIG. 5C is a diagram illustrating a step in the manufacturing method of the third embodiment of the present invention.
Figure 5D:
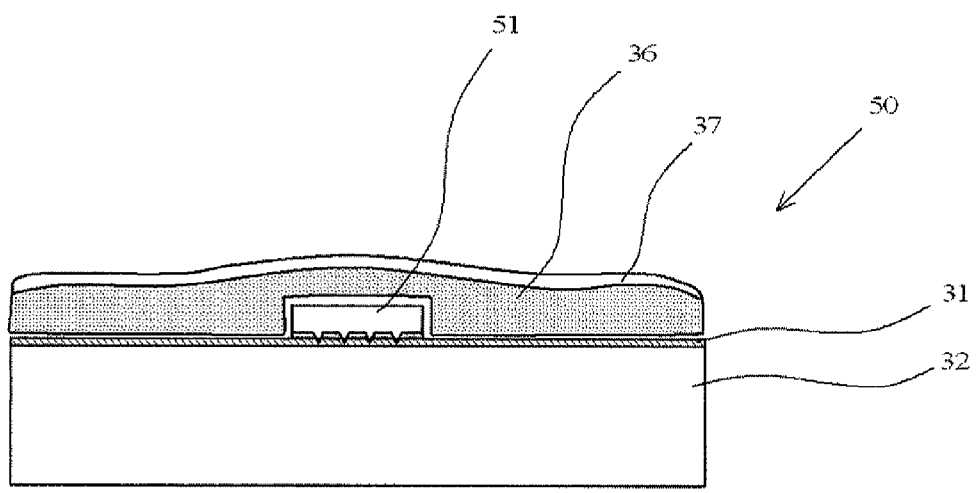
FIG. 5D is a schematic cross-sectional view of a solar cell module manufactured by the manufacturing method of the third embodiment of the present invention.

Next, as shown in FIG. 5C, the internal pressure of the first chamber of the vacuum laminator is increased relative to the internal pressure of the second chamber to press the flexible sheet 14 against the moisture-proof back sheet 37 or the glass plate, and simultaneously the solar cell 32 is heated by the heating stage 21. The surface electrode 31 of the solar cell 32 is thereby conductively connected to the tab lead 51, and the connection area of the solar cell 32 is resin-sealed with the sealing resin layer 36. A solar cell module 50 can be obtained in this manner (FIG. 5D).

In this third embodiment, no pressurizing film is used. Therefore, the third embodiment is advantageous in that, even when it is applied to the light-receiving side, a reduction in light-receiving efficiency due to the use of a pressurizing film is not required to be taken into consideration.

"The operation for increasing the internal pressure of the first chamber of the vacuum laminator relative to the internal pressure of the second chamber," "the sealing resin sheet," "the solar cell having the surface electrode," "the moisture-proof back sheet," and "the glass plate" are as described in the first embodiment of the present invention.

A description will next be given of the third embodiment of the present invention when the convex portions are not formed on the tab lead but are formed on the surface electrode.

More specifically, the third embodiment of the present invention in which the convex portions are formed on the surface electrode is a method for manufacturing a solar cell module in which a solar cell having a surface electrode to which a tab lead is connected is sealed with a resin using a vacuum laminator. The method is characterized by:

using as the tab lead one including a metal substrate and a thermosetting adhesive layer formed on one side of the metal substrate, wherein the surface electrode has a convex portion that is formed in a region to be connected to the tab lead;

using as the vacuum laminator one including a first chamber and a second chamber partitioned by a flexible sheet, wherein the internal pressure of the first chamber and the internal pressure of the second chamber can be controlled independently and a heating stage for heating is provided in the second chamber;

sequentially stacking the solar cell having the surface electrode formed thereon on the heating stage in the second chamber of the vacuum laminator, the tab lead on the surface electrode, a sealing resin layer on the tab lead, and a moisture-proof back sheet or a glass plate on the sealing resin layer; and while the internal pressure of the first chamber of the vacuum laminator is increased relative to the internal pressure of the second chamber to press the flexible sheet against the moisture-proof back sheet or the glass plate, heating the solar cell by the heating stage to thereby connect the convex portion of the surface electrode of the solar cell to the tab lead and to resin-seal the solar cell with the sealing resin layer, whereby the solar cell module is obtained.

In this embodiment, no particular limitation is imposed on the method of forming the convex portions on the surface electrode of the solar cell. Any of a plating method, a photolithographic method, a press method using a mold, and the like can be used.

Figure 8A:
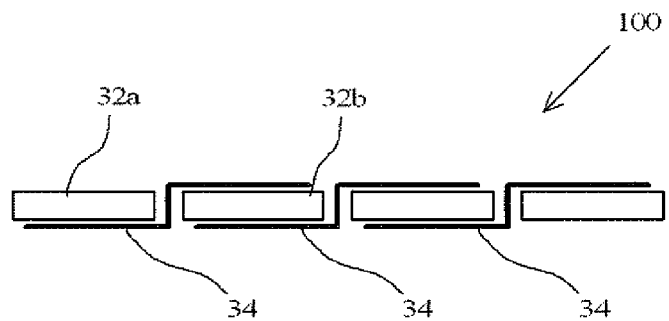
FIG. 8A is a schematic cross-sectional view of a solar cell unit.

In each of the above first to third embodiments of the present invention, the solar cell module manufacturing method in which a tab lead is connected to one side of a solar cell and simultaneously the solar cell is sealed with a resin has been described in detail, but the present invention is not limited thereto. For example, a method in which tab leads for series connection are connected to opposite sides of solar cells that use crystalline photoelectric conversion elements and then the solar cells are sealed with a resin as shown in FIG. 8A (see FIG. 1 in Japanese Patent Application Laid-Open No. 2008-300403) is also within the range of the present invention. In addition, a method in which tabs for outputting power are connected to outermost ones of long thin-film photoelectric conversion elements of a solar cell module that are connected directly in a horizontal direction as shown in FIG. 8B (see FIGS. 3 and 4 in Japanese Patent Application Laid-Open No. 2000-340811) is within the range of the present invention.

Specifically, in the case of FIG. 8A, a plurality of solar cells are prepared. Then a second end of a tab lead 34 having a first end temporarily applied to the rear-side electrode (not shown) of a solar cell 32a is temporarily applied to the front-side electrode (not shown) of an adjacent solar cell 32b through an adhesive under pressure at room temperature or at a low temperature (about 30 to 120° C.). The formation of such a temporarily applied pattern is performed for the plurality of solar cells to obtain a solar cell unit 100. By replacing the solar cell 32 shown in any of FIGS. 3A to 3C, FIGS. 4B to 4D, and FIGS. 5B to 5D with this solar cell unit 100, a solar cell module including the solar cell unit composed of a plurality of solar cells can be obtained.

Figure 8B:
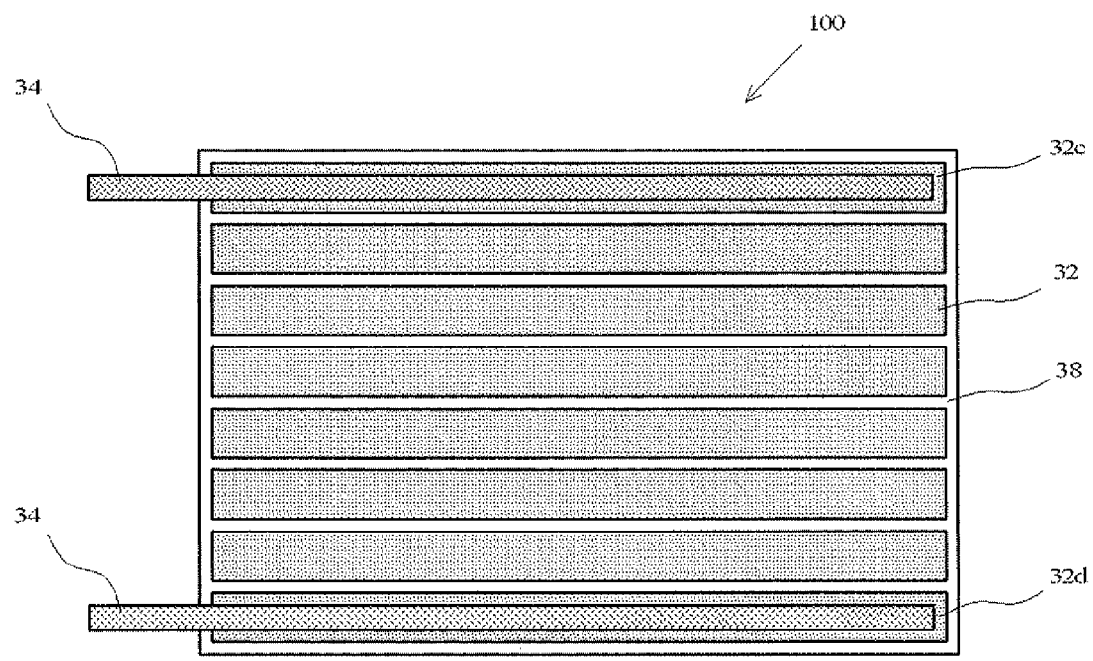
FIG. 8B is a schematic top view of a thin-film solar cell unit.
Figure 9:
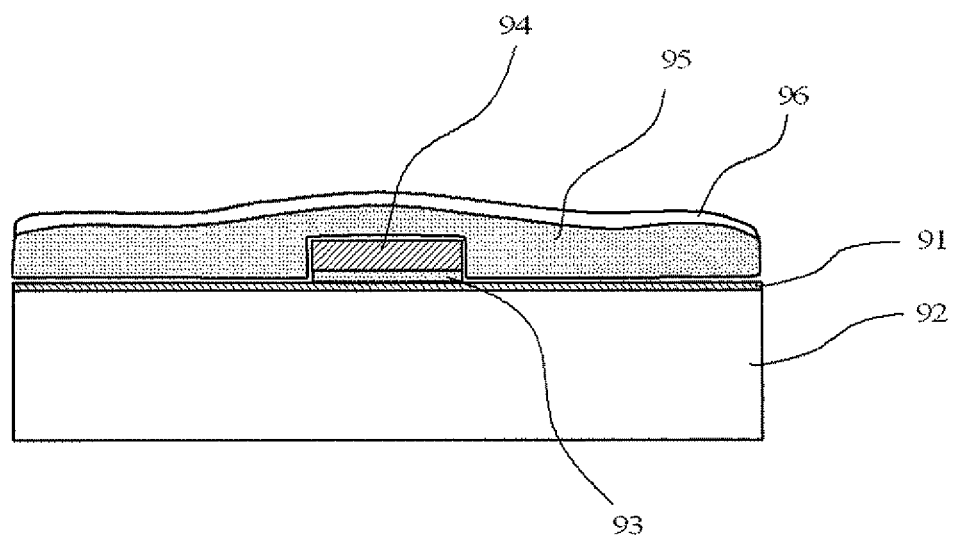
FIG. 9 is a schematic cross-sectional view of a conventional solar cell.

In the case of FIG. 8B, thin-film solar cells 32 including thin-film photoelectric conversion elements are arranged in series in a plane direction on a substrate 38. Tab leads 34 for outputting power are temporarily applied to the surface electrodes (not shown) of an outermost solar cell 32c and another outermost solar cell 32d through an adhesive under pressure at room temperature or at a low temperature (about 30 to 120° C.) to obtain a solar cell unit 100. By replacing the solar cell 32 shown in any of FIGS. 3A to 3C, FIGS. 4B to 4D, and FIGS. 5B to 5D with this solar cell unit 100, a solar cell module including the solar cell unit composed of a plurality of solar cells can be obtained.

In the present invention, when the tab lead and the pressurizing film are sequentially stacked on the adhesive, a pressurizing film having a lead wire pre-stacked thereon may be used.

EXAMPLES

The present invention will next be specifically described by way of Examples.

Example 1

Figure 6A:
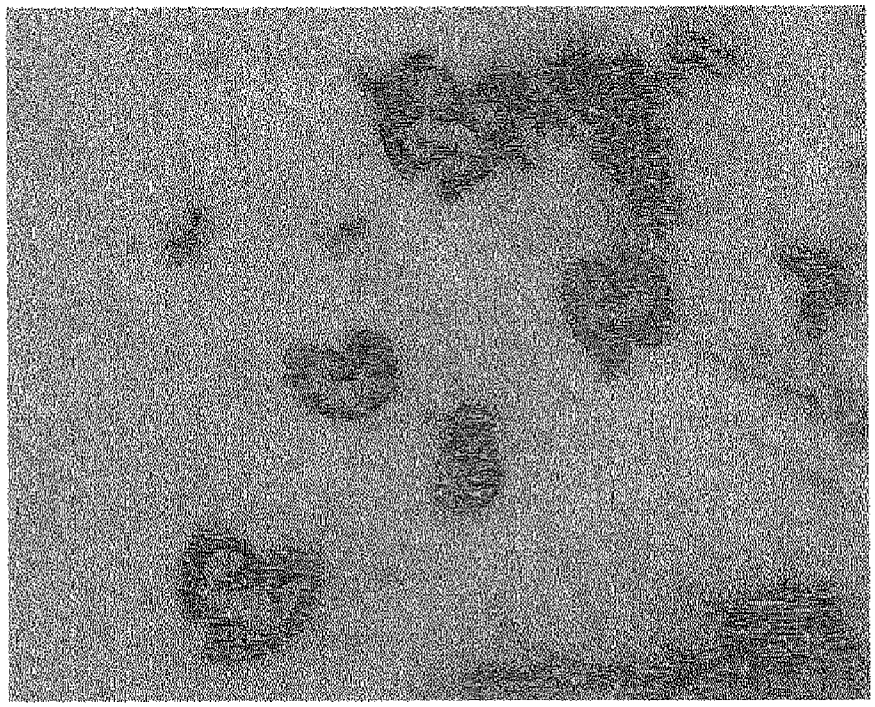
FIG. 6A is a microphotograph of conductive particles in a stacked product produced in Example 1 when the product is observed through its glass surface.

The first embodiment of the present invention was implemented using the following materials as substitutes for the materials of the solar cell.
<Materials Used>
Glass substrate: 30 mm×80 mm×0.7 mm thick
Tab lead: a lead obtained by dip-plating both sides of a Cu wire of 2 mm width×0.15 mm thick with Pb-free solder made of Sn—Ag—Cu to a thickness of 20 μm
Conductive adhesive film: a film obtained by mixing 50 parts by mass of an epoxy resin (EP828, Japan Epoxy Resin Co., Ltd.), 20 parts by mass of a phenoxy resin (YP50, Tohto Kasei Co., Ltd.), 20 parts by mass of a curing agent (HX3941, Asahi Kasei Chemicals Corporation), and 10 parts by mass of conductive particles (AUL, Sekisui Chemical Co., Ltd.) having an average particle diameter of 10 μm, adding toluene to the mixture such that the concentration of solids was 30%, and applying the resultant mixture to a copper foil using a roll coater to a dry thickness of 25 μm, and drying the product in an oven at 80° C.
Pressurizing film: a polyimide film of 30 mm×40 mm×85 μm (thick)
Sealing resin sheet: an ethylene-vinyl acetate copolymer sheet of 30 mm×80 mm×0.5 mm
Moisture-proof back sheet: a polyethylene terephthalate film (35 μm thick) used as a substitute for the moisture-proof back sheet The glass substrate was placed on the heating stage in the second chamber of the vacuum laminator shown in FIG. 1. The conductive adhesive film (width: 2 mm, length: 5 mm, and thickness: 0.05 mm) was placed on the surface of the glass substrate, and the tab lead, the pressurizing film, the sealing resin sheet, and the moisture-proof back sheet were placed on the conductive adhesive film. While the heating stage was maintained at 150° C., the pressures of the first and second chambers were reduced to 133 Pa. Then while the reduced pressure of the second chamber was maintained, air was introduced to the first chamber to bring it to atmospheric pressure. After this state was maintained for 5 minutes, air was introduced to the second chamber to bring it to atmospheric pressure. The obtained stacked product was observed under a microscope from the rear side (the glass surface side), and the conductive particles were found to be crushed (FIG. 6A).

Example 2

A stacked product was obtained by the same procedure as in Example 1 except that a conductive adhesive paste obtained by mixing 50 parts by mass of an epoxy resin (EP828, Japan Epoxy Resin Co., Ltd.), 40 parts by mass of a curing agent (HX3941, Asahi Kasei Chemicals Corporation), and 10 parts by mass of conductive particles (AUL, Sekisui Chemical Co., Ltd.) having an average particle diameter of 10 μm was used instead of the conductive adhesive film and that the conductive adhesive paste was applied to the surface of the glass substrate to a width of 2 mm, a length of 5 mm, and a thickness of 0.05 mm. The obtained stacked product was observed under a microscope from the rear side (the glass surface side), and the conductive particles were found to be crushed.

Comparative Example 1

Figure 6B:
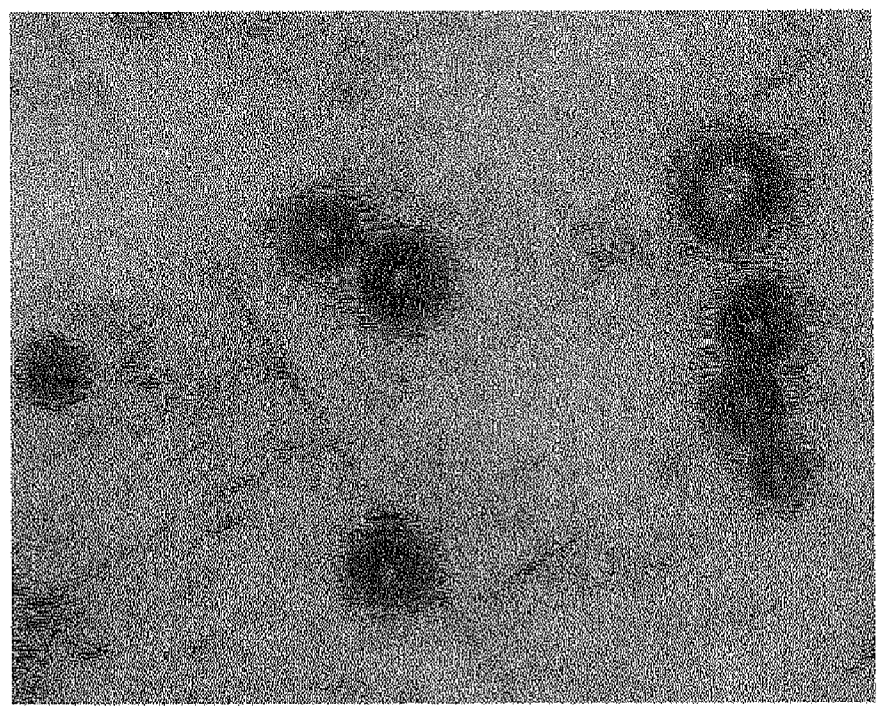
FIG. 6B is a microphotograph of conductive particles in a stacked product produced in Comparative Example 1 when the product is observed through its glass surface.

A stacked product was obtained by repeating the same procedure as in Example 1 except that the pressurizing film was not used. The obtained stacked product was observed under a microscope from the rear side (the glass surface side), and crushed conductive particles were not found (FIG. 6B).

Example 3

Figure 7A:
FIG. 7A is a microphotograph of conductive particles in a stacked product produced in Example 3 when the product is observed through its glass surface.

The second embodiment of the present invention was implemented using the following materials as substitutes for the materials of the solar cell.
<Materials Used
Glass substrate with ITO: 30 mm×80 mm×0.7 mm thick
Tab lead: a Cu wire of 2 mm width×0.12 mm thick
Conductive adhesive film: a film obtained by mixing 50 parts by mass of an epoxy resin (EP828, Japan Epoxy Resin Co., Ltd.), 20 parts by mass of a phenoxy resin (YP50, Tohto Kasei Co., Ltd.), 20 parts by mass of a curing agent (HX3941, Asahi Kasei Chemicals Corporation), and 10 parts by mass of conductive particles (AUL, Sekisui Chemical Co., Ltd.) having an average particle diameter of 10 μm, adding toluene to the mixture such that the concentration of solids was 30%, and applying the resultant mixture to a copper foil using a roll coater to a thickness of 10 μm, and drying the product in an oven at 80° C. (the thickness of the resin layer: 3 μm)
Sealing resin sheet: an ethylene-vinyl acetate copolymer sheet of 30 mm×80 mm×0.5 mm
Moisture-proof back sheet: a polyethylene terephthalate film (35 μm thick) used as a substitute for the moisture-proof back sheet The glass substrate with ITO was placed on the heating stage in the second chamber of the vacuum laminator shown in FIG. 1. The tab lead was temporarily applied to the glass substrate with the conductive adhesive film (of the type in which conductive particles protruded from the surface of the film) facing the ITO electrode on the surface of the glass substrate, and the sealing resin sheet and the polyethylene terephthalate film with a thickness of 80 μm were placed thereon. While the heating stage was maintained at 150° C., the pressures of the first and second chambers were reduced to 133 Pa. Then while the reduced pressure of the second chamber was maintained, air was introduced to the first chamber to bring it to atmospheric pressure. After this state was maintained for 5 minutes, air was introduced to the second chamber to bring it to atmospheric pressure. The obtained stacked product was observed under a microscope from the rear side (the glass surface side), and the conductive particles were found to be crushed (FIG. 7A). The resistance value was measured and found to be 5 mΩ.

Comparative Example 2

Figure 7B:
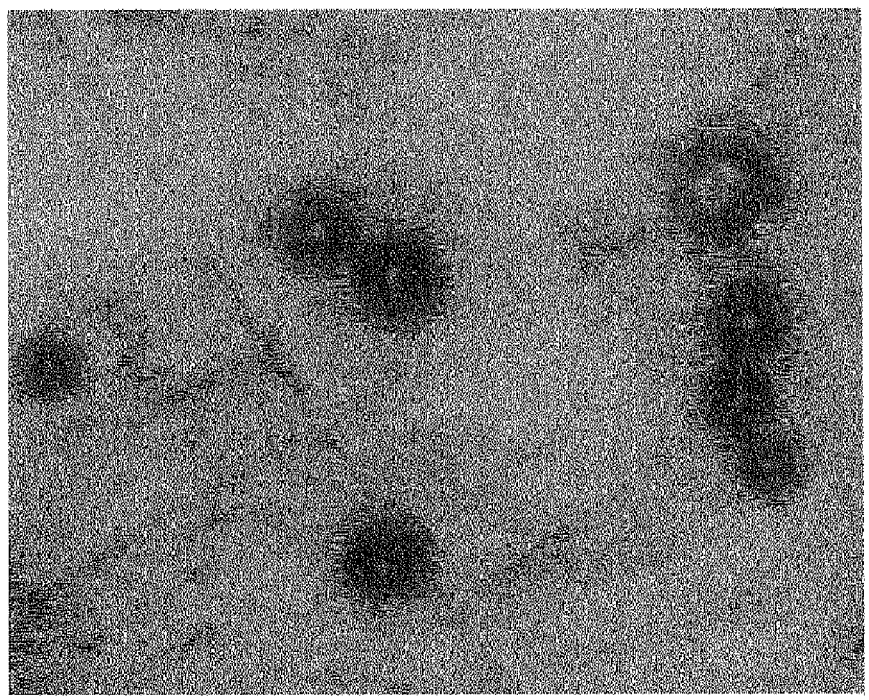
FIG. 7B is a microphotograph of conductive particles in a stacked product produced in Comparative Example 2 when the product is observed through its glass surface.

A stacked product was obtained by repeating the same procedure as in Example 2 except that the conductive adhesive film produced in Example 1 was used. The obtained stacked product was observed under a microscope from the rear side (the glass surface side), and crushed conductive particles were not found (FIG. 7B). The measurement of resistance value was attempted, and the resistance value could not be measured. Electric connection was not established.

Example 4

The third embodiment of the present invention was implemented using the following materials as substitutes for the materials of the solar cell.
<Materials Used>
Glass substrate with ITO: 30 mm×80 mm×0.7 mm thick
Tab lead: a Cu wire of 2 mm width×0.12 mm thick in which convex protrusions (height: 10 μm) were formed on one side at a density of about 50,000 protrusions/mm² using the matte treatment technique
Thermosetting adhesive layer: an adhesive layer obtained by applying, to the surface of the tab lead having the convex protrusions formed thereon, a thermosetting adhesive (20 parts by mass of a phenoxy resin (YP50, Tohto Kasei Co., Ltd.), 50 parts by mass of an epoxy resin (EP828, Japan Epoxy Resin Co., Ltd.), and 20 parts by mass of a curing agent (HX3941, Asahi Kasei Chemicals Corporation)) to a thickness of 7 μm by the application-drying method
Sealing resin sheet: an ethylene-vinyl acetate copolymer sheet of 30 mm×80 mm×0.5 mm
Moisture-proof back sheet: a polyethylene terephthalate film (35 μm thick) used as a substitute for the moisture-proof back sheet The glass substrate was placed on the heating stage in the second chamber of the vacuum laminator shown in FIG. 1. The tab lead was temporarily applied to the glass substrate such that the convex protrusions of the tab lead faced the ITO electrode on the surface of the glass substrate, and the sealing resin sheet and the polyethylene terephthalate film with a thickness of 80 μm were placed thereon. While the heating stage was maintained at 150° C., the pressures of the first and second chambers were reduced to 133 Pa. Then while the reduced pressure of the second chamber was maintained, air was introduced to the first chamber to bring it to atmospheric pressure. After this state was maintained for 5 minutes, air was introduced to the second chamber to bring it to atmospheric pressure. The obtained stacked product was observed under a microscope from the rear side (the glass surface side), and the convex protrusions were found to be crushed. The resistance value was measured and found to be 5 mΩ.

Comparative Example 3

A stacked product was obtained by repeating the same procedure as in Example 2 except that a flat tab lead having no convex protrusions formed thereon was used. The resistance value of the obtained stacked product was measured and found to be open.

INDUSTRIAL APPLICABILITY

Each of the manufacturing methods of the present invention is used to manufacture a solar cell module in which a solar cell having a surface electrode to which a tab lead is connected is sealed with a resin. In each manufacturing method, the tab lead connecting step of connecting the surface electrode to the tab lead and the resin sealing step of sealing the solar cell with a sealing resin can be performed simultaneously at a relatively low temperature, i.e., the temperature for the resin sealing step. Therefore, the manufacturing method is useful for the manufacturing of a solar cell and a solar cell unit including a combination of solar cells. Specifically, the manufacturing method is useful for a crystalline solar cell when an inner lead is connected to a bus bar electrode formed by screen printing using silver paste and useful for a thin-film solar cell when a surface electrode is connected to an outer lead.

DESCRIPTION OF REFERENCE NUMERALS 10 vacuum laminator
11 upper unit
12 lower unit
13 sealing member
14 flexible sheet
15 first chamber
16 second chamber
17, 17a, 17b, 18, 18a, 18b pipe
19, 20 switching valve
21 heating stage
22 stacked product
30, 40, 50 solar cell module
31 surface electrode
32, 32a, 32b, 32c, 32d solar cell
33 adhesive
34, 51 tab lead
35 pressurizing film
36 sealing resin layer
37 moisture-proof back sheet
38 substrate
41 conductive adhesive film
42 thermosetting resin film base
43 conductive particle
52 metal substrate
52a convex portion
53 thermosetting adhesive layer
100 solar cell unit

The invention claimed is:
1. A method for manufacturing a solar cell module in which a solar cell having a surface electrode to which a tab lead is connected with an adhesive is sealed with a resin using a vacuum laminator, the method comprising:
using as the vacuum laminator one including a first chamber and a second chamber partitioned by a flexible sheet, wherein an internal pressure of the first chamber and an internal pressure of the second chamber can be controlled independently and a heating stage for heating is provided in the second chamber;
sequentially stacking the solar cell having the surface electrode formed thereon on the heating stage in the second chamber of the vacuum laminator, the adhesive on the surface electrode, the tab lead on the adhesive, a pres- surizing film on the tab lead, a sealing resin layer on the pressurizing film, and a moisture-proof back sheet or a glass plate on the sealing resin layer; and while the internal pressure of the first chamber of the vacuum laminator is increased relative to the internal pressure of the second chamber to press the flexible sheet against the moisture-proof back sheet or the glass plate, heating the solar cell by the heating stage to thereby connect the surface electrode of the solar cell to the tab lead and to resin-seal the solar cell with the sealing resin layer, whereby the solar cell module is obtained.

2. The manufacturing method according to claim 1, wherein an operation for increasing the internal pressure of the first chamber of the vacuum laminator relative to the internal pressure of the second chamber includes reducing the internal pressures of the first chamber and the second chamber and then opening the first chamber to atmosphere while the reduced pressure inside the second chamber is maintained.

3. The manufacturing method according to claim 1, wherein the adhesive is a conductive adhesive film.

4. The manufacturing method according to claim 1, wherein circumferential edges of the pressurizing film are resin-sealed with the sealing resin layer.

5. The manufacturing method according to claim 1, wherein the sealing resin layer is made from an ethylene/vinyl acetate copolymer sheet.

6. The manufacturing method according to claim 1, wherein the solar cell is a thin-film solar cell or a crystalline solar cell in which the surface electrode and the tab lead are connected to each other with a conductive adhesive film.

7. The manufacturing method according to claim 1, wherein the solar cell is a component of a solar cell unit including a plurality of solar cells connected together.

8. The manufacturing method according to claim 1, wherein when the tab lead and the pressurizing film are sequentially stacked on the adhesive, a pressurizing film having a lead wire that has been stacked thereon in advance is used.

9. A method for manufacturing a solar cell module in which a solar cell having a surface electrode to which a tab lead is connected through a conductive adhesive film is sealed with a resin using a vacuum laminator, the method comprising:

using as the conductive adhesive film one including a thermosetting resin film base and conductive particles that have a diameter larger than a thickness of the thermosetting resin film base and are held therein, the conductive particles protruding from at least one side of the thermosetting resin film base;

using as the vacuum laminator one including a first chamber and a second chamber partitioned by a flexible sheet, wherein an internal pressure of the first chamber and an internal pressure of the second chamber can be controlled independently and a heating stage for heating is provided in the second chamber;

sequentially stacking the solar cell having the surface electrode formed thereon on the heating stage in the second chamber of the vacuum laminator, the conductive adhesive film on the surface electrode, the tab lead on the conductive adhesive film, a sealing resin layer on the tab lead, and a moisture-proof back sheet or a glass plate on the sealing resin layer, provided that the conductive adhesive film is stacked on the surface electrode such that the surface of the conductive adhesive film from which the conductive particles protrude faces the tab lead or the surface electrode; and while the internal pressure of the first chamber of the vacuum laminator is increased relative to the internal pressure of the second chamber to press the flexible sheet against the moisture-proof back sheet or the glass plate, heating the solar cell by the heating stage to thereby conductively connect the surface electrode of the solar cell to the tab lead and to resin-seal the solar cell with the sealing resin layer, whereby the solar cell module is obtained.

10. The manufacturing method according to claim 9, wherein an operation for increasing the internal pressure of the first chamber of the vacuum laminator relative to the internal pressure of the second chamber includes reducing the internal pressures of the first chamber and the second chamber and then opening the first chamber to atmosphere while the reduced pressure inside the second chamber is maintained.

11. The manufacturing method according to claim 9, wherein the sealing resin layer is made from an ethylene/vinyl acetate copolymer sheet.

12. The manufacturing method according to claim 9, wherein the solar cell is a thin-film solar cell or a crystalline solar cell in which the surface electrode and the tab lead are connected to each other with a conductive adhesive film.

13. The manufacturing method according to claim 9, wherein when the tab lead and the pressurizing film are sequentially stacked on the adhesive, a pressurizing film having a lead wire that has been stacked thereon in advance is used.

14. The manufacturing method according to claim 9, wherein the solar cell is a component of a solar cell unit including a plurality of solar cells connected together.

15. A method for manufacturing a solar cell module in which a solar cell having a surface electrode to which a tab lead is connected is sealed with a resin using a vacuum laminator, the method comprising:

using as the tab lead one including a metal substrate and a thermosetting adhesive layer formed on one side of the metal substrate, the metal substrate having a convex portion that protrudes from the thermosetting adhesive layer so as to be connectable to the surface electrode, or as the tab lead one including a metal substrate and a thermosetting adhesive layer formed on one side of the metal substrate, the surface electrode having a convex portion that is formed in a region to be connected to the tab lead;

using as the vacuum laminator one including a first chamber and a second chamber partitioned by a flexible sheet, wherein an internal pressure of the first chamber and an internal pressure of the second chamber can be controlled independently and a heating stage for heating is provided in the second chamber;

sequentially stacking the solar cell having the surface electrode formed thereon on the heating stage in the second chamber of the vacuum laminator, the tab lead on the surface electrode, a sealing resin layer on the tab lead, and a moisture-proof back sheet or a glass plate on the sealing resin layer, provided that the tab lead including the metal substrate having the convex portion protruding from the thermosetting adhesive layer is stacked on the surface electrode such that the surface of the tab lead from which the convex portion of the metal substrate protrudes faces the surface electrode; and while the internal pressure of the first chamber of the vacuum laminator is increased relative to the internal pressure of the second chamber to press the flexible sheet against the moisture-proof back sheet or the glass plate, heating the solar cell by the heating stage to thereby connect the surface electrode of the solar cell to the convex portion of the tab lead and to resin-seal the solar cell with the sealing resin layer, whereby the solar cell module is obtained.

16. The manufacturing method according to claim 15, wherein an operation for increasing the internal pressure of the first chamber of the vacuum laminator relative to the internal pressure of the second chamber includes reducing the internal pressures of the first chamber and the second chamber and then opening the first chamber to atmosphere while the reduced pressure inside the second chamber is maintained.

17. The manufacturing method according to claim 15, wherein the sealing resin layer is made from an ethylene/vinyl acetate copolymer sheet.

18. The manufacturing method according to claim 15, wherein the solar cell is a thin-film solar cell or a crystalline solar cell in which the surface electrode and the tab lead are connected to each other with a conductive adhesive film.

19. The manufacturing method according to claim 15, wherein when the tab lead and the pressurizing film are sequentially stacked on the adhesive, a pressurizing film having a lead wire that has been stacked thereon in advance is used.

20. The manufacturing method according to claim 15, wherein the solar cell is a component of a solar cell unit including a plurality of solar cells connected together.

\* \* \* \* \*